(12) United States Patent
Chen et al.

(10) Patent No.: US 7,892,968 B2
(45) Date of Patent: Feb. 22, 2011

(54) VIA GOUGING METHODS AND RELATED SEMICONDUCTOR STRUCTURE

(75) Inventors: Shyng-Tsong Chen, Patterson, NY (US); Steven J. Holmes, Guilderland, NY (US); David V. Horak, Essex Junction, VT (US); Takeshi Nogami, Schenectady, NY (US); Shom Ponoth, Clifton Park, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 12/017,141

(22) Filed: Jan. 21, 2008

(65) Prior Publication Data

US 2009/0184400 A1 Jul. 23, 2009

(51) Int. Cl.
*H01L 21/4763* (2006.01)
(52) U.S. Cl. ...................... 438/639; 438/637
(58) Field of Classification Search .............. 438/618, 438/637, 639
See application file for complete search history.

(56) References Cited

U.S. PATENT DOCUMENTS

| | | | | |
|---|---|---|---|---|
| 5,552,344 A | * | 9/1996 | Jang et al. | 438/624 |
| 6,040,243 A | * | 3/2000 | Li et al. | 438/687 |
| 6,969,539 B2 | | 11/2005 | Gordon et al. | |
| 6,972,253 B2 | * | 12/2005 | Liu et al. | 438/627 |
| 7,332,428 B2 | * | 2/2008 | Beck | 438/637 |
| 2004/0115928 A1 | * | 6/2004 | Malhotra et al. | 438/639 |
| 2006/0024953 A1 | * | 2/2006 | Papa Rao et al. | 438/629 |
| 2006/0081986 A1 | * | 4/2006 | Clevenger et al. | 257/751 |
| 2006/0121724 A1 | * | 6/2006 | Yue et al. | 438/625 |
| 2007/0049007 A1 | * | 3/2007 | Yang et al. | 438/625 |
| 2007/0158851 A1 | * | 7/2007 | Chanda et al. | 257/774 |
| 2007/0205482 A1 | * | 9/2007 | Yang et al. | 257/499 |

OTHER PUBLICATIONS

Dennis Hausmann, Jill Becker, Shenlong Wang, Roy G. Gordon, "Rapid vapor deposition of highly conformal silica nanolaminates," Oct. 11, 2002, Science vol. 298 p. 402-406.*

* cited by examiner

*Primary Examiner*—Charles D Garber
*Assistant Examiner*—Bryan R Junge
(74) *Attorney, Agent, or Firm*—Wenjie Li; Hoffman Warnick LLC

(57) ABSTRACT

Methods for via gouging and a related semiconductor structure are disclosed. In one embodiment, the method includes forming a via opening in a dielectric material, the via opening aligned with a conductor; forming a protective coating over the dielectric material and in the via opening; performing via gouging; and removing the protective coating over horizontal surfaces of the dielectric material. A semiconductor structure may include a via having an interface with a conductor, the interface including a three-dimensionally shaped region extending into and past a surface of the conductor, wherein an outer edge of the three-dimensionally shaped region is distanced from an outermost surface of the via.

18 Claims, 5 Drawing Sheets

VIA GOUGING METHODS AND RELATED SEMICONDUCTOR STRUCTURE

BACKGROUND

1. Technical Field

The disclosure relates generally to semiconductor fabrication, and more particularly, to methods relating to via gouging and a resulting semiconductor structure.

2. Background Art

In the semiconductor fabrication industry, via gauging is used to enhance an interface between a via and a metal layer (Mx) line to which the via electrically connects. Via gouging is typically accomplished using physical argon (Ar) sputtering to gouge an upper surface of a lower metal layer (Mx) line such that a via formed thereto has a three-dimensional shaped end, which, among other things, increases conductivity. Unfortunately, the argon (Ar) sputtering process also interacts with a bottom of the dielectric at a surface of the metal layer (Mx) line. As the semiconductor industry moves to lower dielectric constant (k) interlevel dielectrics, the damage to the dielectric is leading to reliability related concerns, e.g., time dependent dielectric breakdown (TDDB).

SUMMARY

Methods for via gouging and a related semiconductor structure are disclosed. In one embodiment, the method includes forming a via opening in a dielectric material, the via opening aligned with a conductor; forming a protective coating over the dielectric material and in the via opening; performing via gouging; and removing the protective coating over horizontal surfaces of the dielectric material. A semiconductor structure may include a via having an interface with a conductor, the interface including a three-dimensionally shaped region extending into and past a surface of the conductor, wherein an outer edge of the three-dimensionally shaped region is distanced from an outermost surface of the via.

A first aspect of the disclosure provides a method comprising: forming a via opening in a dielectric material, the via opening aligned with a conductor; depositing an oxide coating over the dielectric material and in the via opening; performing via gouging; and removing the oxide coating over horizontal surfaces of the dielectric material.

A second aspect of the disclosure provides a method comprising: forming a via opening in a dielectric material, the via opening aligned with a conductor; forming a protective coating over the dielectric material and in the via opening; performing via gouging; and removing the protective coating over horizontal surfaces of the dielectric material.

A third aspect of the disclosure provides a semiconductor structure comprising: a via having an interface with a conductor, the interface including a three-dimensionally shaped region extending into and past a surface of the conductor, wherein an outer edge of the three-dimensionally shaped region is distanced from an outermost surface of the via.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
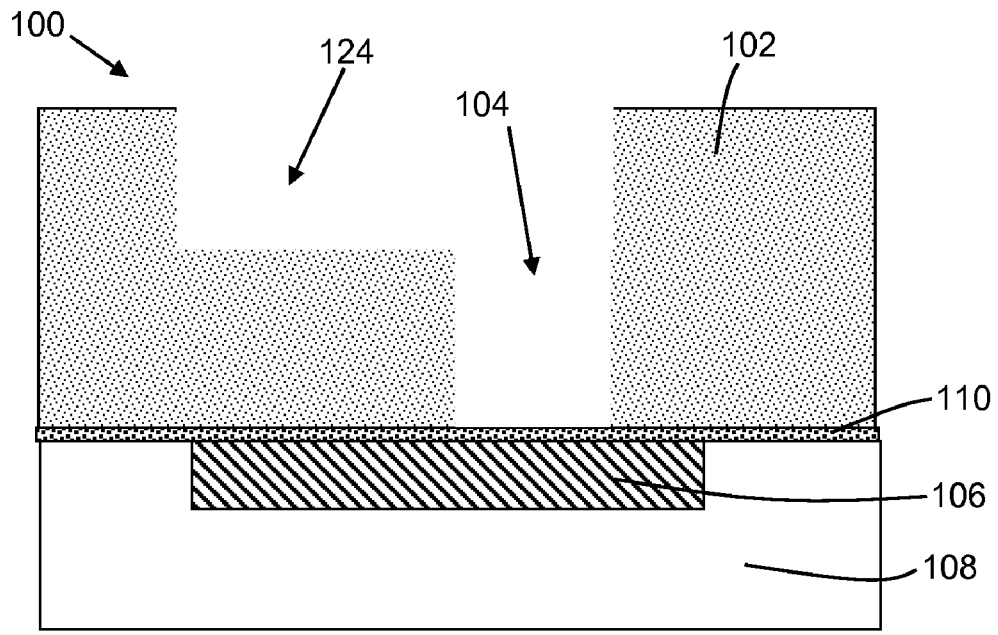
FIGS. 1-5 show one embodiment of a method according to the disclosure.
Figure 2:
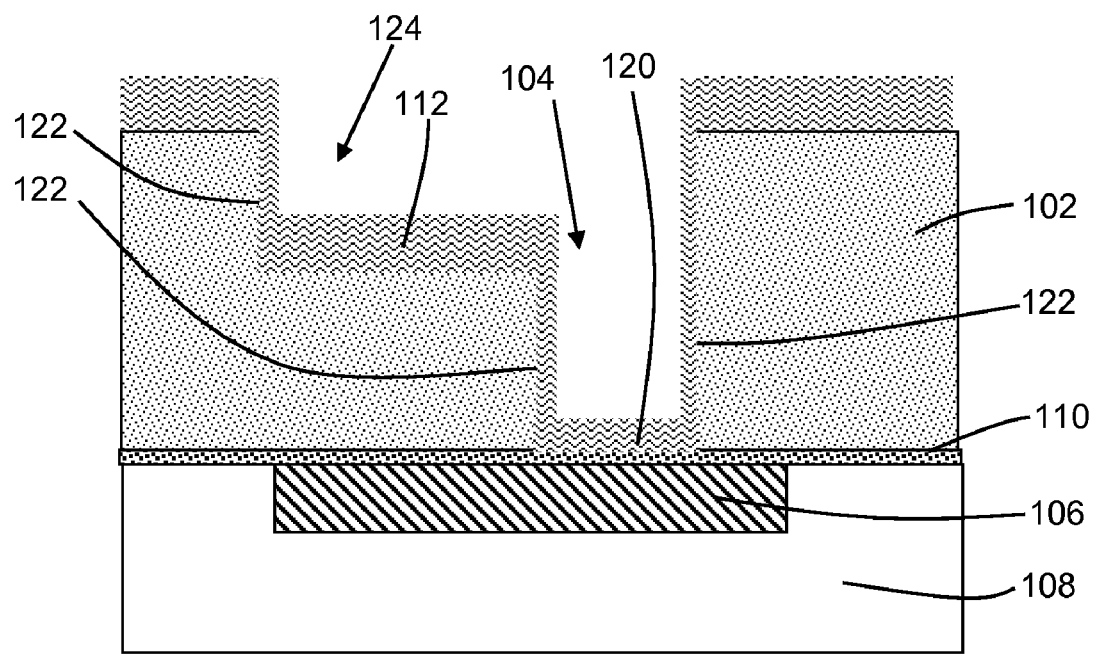

Referring to the drawings, FIGS. 1-5 show one embodiment of a method according to the disclosure. FIG. 1 shows a preliminary structure 100 including a dielectric material 102 having a via opening 104 formed therein. Via opening 104 may be formed using any now known or later developed process such as a Damascene or dual Damascene (shown, with a line opening 124) process. A conductor 106 is aligned with via opening 104. Conductor 106 is shown in another dielectric material 108 separated from dielectric material 102 by a cap layer 110. However, conductor 106 may be positioned in dielectric material 102, in which case cap layer 110 may be omitted. Dielectric material 102 may include but is limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), JSR (a spin-on silicon-carbon contained polymer material available form JSR Corporation), other low dielectric constant (<3.9) material, or layers thereof. Dielectric material 108 may include similar material. Conductor 106 may include, for example, copper (Cu), aluminum (Al) or other conductive material commonly used in semiconductor devices. Conventional liners (not shown) may also be provided, e.g., tantalum nitride, titanium nitride, etc.

FIGS. 2-5 show one embodiment of the method that includes forming a protective coating 112 over dielectric material 102 and in via opening 104 in a non-conformal manner. In one embodiment, protective coating 112 includes an oxide coating (e.g., silicon oxide ($SiO_2$), however, other coatings that, for example, exhibit poor conformality during deposition, support controlled isotropic etching, and can be removed with very high selectively to the existing materials, may be employed. In the embodiment shown in FIG. 2, protective coating 112 depositing includes non-conformally depositing the protective coating, resulting in protective coating 112 depositing thicker over horizontal surfaces of dielectric material 102 and a bottom 120 of via opening 104 than on sidewalls 122 of via opening 104 (and line opening 124 where dual Damascene is used). That is, the deposition on bottom 120 of via opening 104 is thicker than the deposition on bottom of line opening 124 and on an uppermost surface of dielectric material 102. The depositing may include any now known or later developed manner of depositing a material such that it has a progressively thicker thickness for sidewalls compared to a bottom of a deep opening compared to horizontal surfaces outside of the deep opening. For example, any variety of chemical vapor deposition (CVD) may be used such as low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD) or metalorganic CVD (MOCVD).

Figure 3:
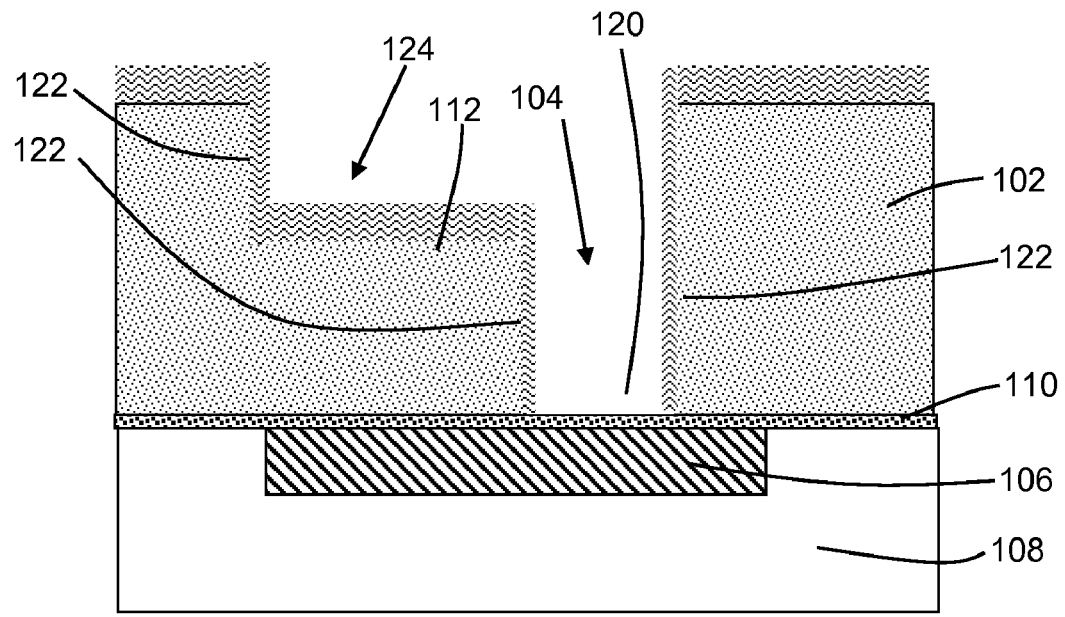
Figure 4:
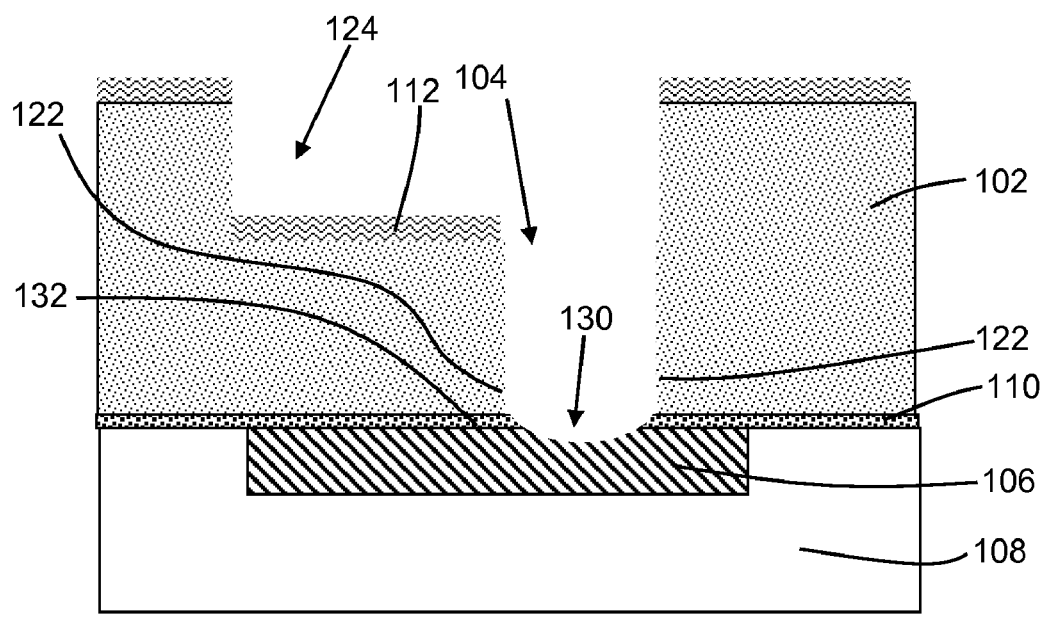

FIG. 3 shows isotropically etching protective coating 112 (prior to via gouging as shown in FIG. 4) to remove protective coating 112 over conductor 106. The isotropic etching may include, for example, a hydrofluoric acid (HF) etch or another etching technique that is consistent with etching of the deposited material and not dielectric material 102 and cap layer 110. This process etches the same amount of protective coating 112 everywhere, yielding no coating 112 on bottom 120 of via opening 104 and a thick enough coating 112 on sidewalls 122 near conductor 106 to protect dielectric material 102 during via gouging, if necessary.

FIG. 4 shows performing of via gouging to form a gouge 130 in conductor 106. The via gouging may include any now known or later developed technique, e.g., physical argon (Ar) sputtering. As shown in FIG. 4, gouge 130 has a three-dimensional shape (e.g., dome shaped) that extends into and beyond a surface 132 of conductor 106 (typically with very little lateral etch during gouging). Where cap layer 110 is not removed, as shown in FIG. 3, the via gouging would remove cap layer 110 over conductor 106. Cap layer 110 may be in place to protect the metallurgy during the isotropic etch.

Figure 5:
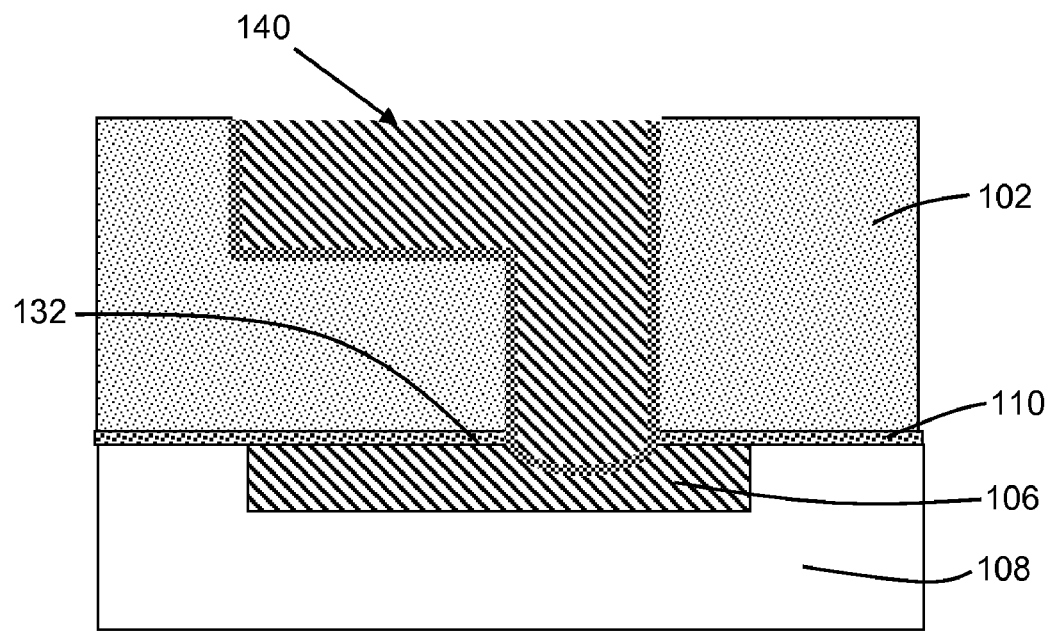

FIG. 5 shows removing protective coating 112 (FIG. 4) over the horizontal (and vertical) surfaces of dielectric material 102. This process may include any technique appropriate for protective coating 112. For example, where protective coating 112 includes an oxide, the removing may include, for example, using a hydrofluoric acid (HF) based process or chemical oxide removal (COR) process. Conventional subsequent processing for forming a contact and/or line structure 140 are also shown, e.g., depositing a liner, depositing a conductor and planarizing.

Figure 6:
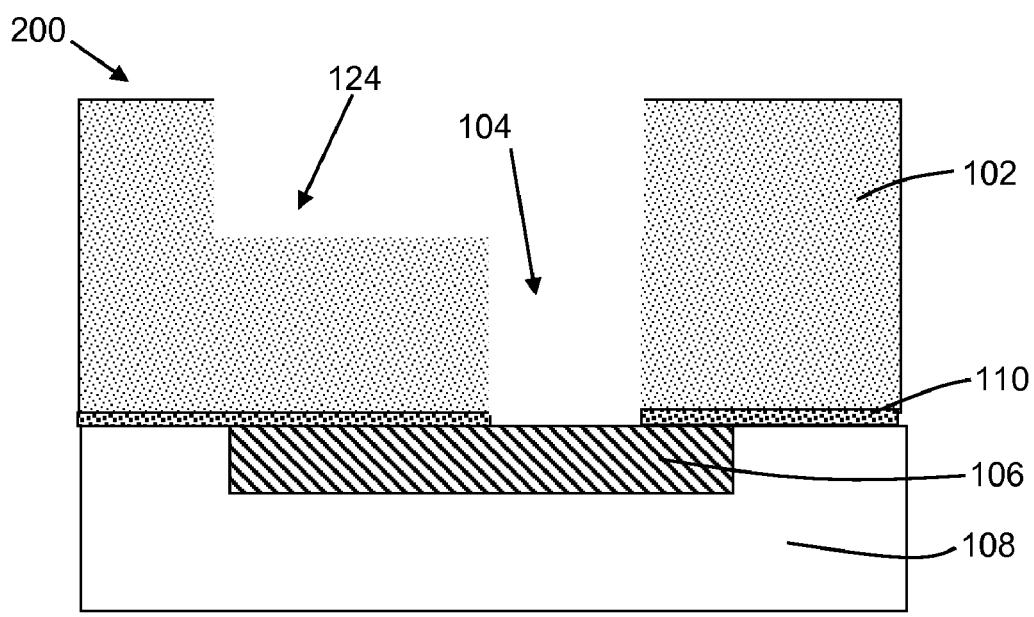
FIGS. 6-9 show another embodiment of a method, with FIG. 9 showing one embodiment of a semiconductor structure, according to the disclosure.

Turning to FIGS. 6-9, an alternative embodiment of the method is illustrated. In this embodiment, as shown in FIG. 6, a preliminary structure 200 is provided which is substantially similar to preliminary structure 100 except that cap layer 110 is removed over conductor 106 prior to depositing protective coating 112. Cap layer 110 may be removed, for example, using a reactive ion etch at the end of the overall dual damascene etch sequence (RIE).

Figure 7:
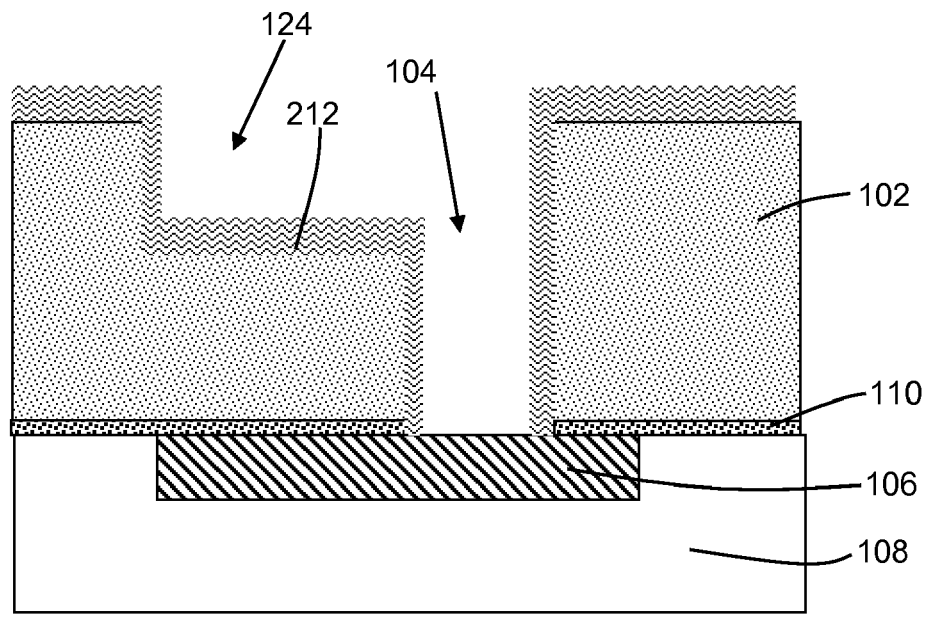

FIG. 7 shows selectively depositing protective layer 212 over dielectric material 102 and in via opening 104 but not on conductor 106. In one embodiment, protective layer 212 may include an oxide, and this process may include selectively growing protective layer 212 using an atomic layer deposition technique similar to that described in U.S. Pat. No. 6,969,539, which is hereby incorporated by reference. In one embodiment, protective layer 212 may be deposited using a trimethyl aluminum (AlMe$_3$) vapor at approximately 225° C., followed by a Tris(tbutoxy) silanol vapor at approximately 225° C. In this case, the process may occur for approximately 5-10 minutes at a pressure of approximately 3 milliTorr. However, other processes and parameters may also be employed. In any event, protective layer 212 does not deposit on conductor 106.

Figure 8:
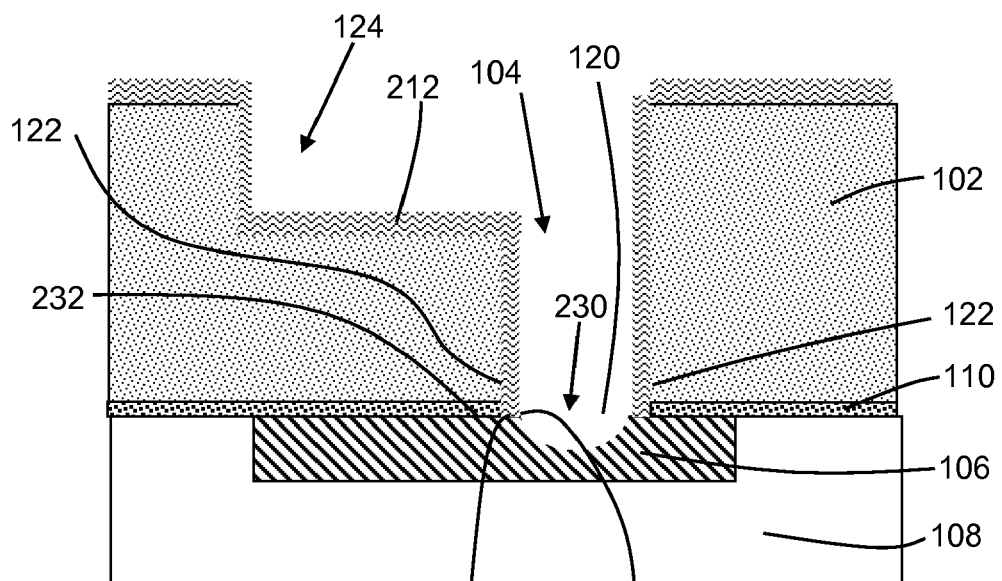

FIG. 8 shows performing of via gouging to form a gouge 230 in conductor 106. The via gouging may include any now known or later developed technique, e.g., physical argon (Ar) sputtering. The via gouging interacts with the deposited protective layer 212 on bottom 120 of via opening 104, thereby sparing dielectric material 102 from damage. As shown in FIG. 8, gouge 230 has a three-dimensional shape that extends into and beyond a surface 232 of conductor 106. In contrast to the FIGS. 1-5 embodiment, as shown in FIG. 8, gouge 230 in conductor 106 includes an outer edge 234 distanced from sidewall 122 of dielectric material 102 by protective coating 212.

Figure 9:
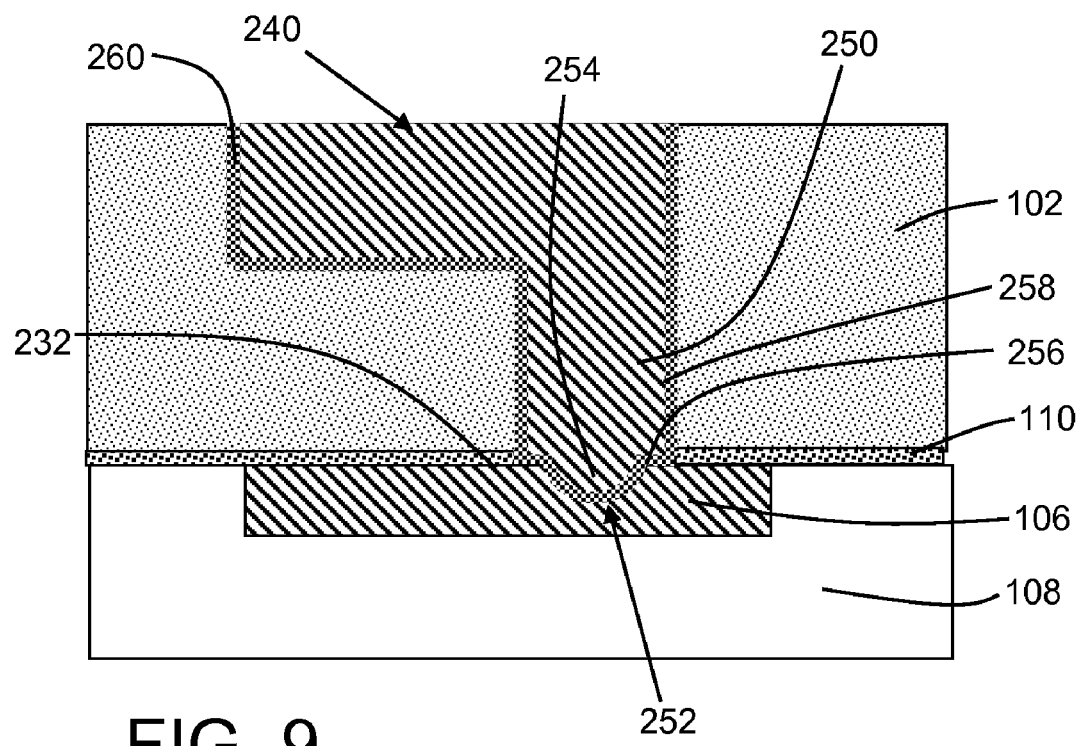

FIG. 9 shows removing protective coating 212 (FIG. 8) over horizontal surfaces of dielectric material 102. This process may include any technique appropriate for protective coating 212. For example, where protective coating 212 includes an oxide, the removing may include, for example, using a hydrofluoric acid (HF) based process or chemical oxide removal (COR) process (non-plasma dry etch). Conventional subsequent processing for forming a contact and/or line structure 240 are also shown, e.g., depositing a liner, depositing a conductor and planarizing.

As noted above, in contrast to the FIG. 5 embodiment, gouge 230 in conductor 106 includes outer edge 234 distanced from sidewall 122 of dielectric material 102 by protective coating 212. In one embodiment, as shown in FIG. 8, the distance includes a substantially planar region 236 surrounding the three-dimensionally shaped region of gouge 230. However, the region does not necessarily have to be substantially planar, e.g., it could be curved, a tilted circular plane, etc., due to process variations. As shown in FIG. 9, the process of FIGS. 6-9 results in a semiconductor structure 202 having a via 250 having an interface 252 with conductor 106, the interface including a three-dimensionally shaped region 254 (filled gouge) extending into and past a surface 232 of conductor 106. An outer edge 256 of three-dimensionally shaped region 254 is distanced from an outermost surface 258 of via 250. The previous statement applies regardless of whether outer edge 256 and/or outermost surface 258 is/are considered to include a liner 260 or not. The distance between outer edge 256 and outermost surface 258 of via 250 may include a substantially planar region 259 surrounding three-dimensionally shaped region 254, which is structurally different than conventional vias formed using via gouging.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:
1. A method comprising:
forming a via opening in a dielectric material, the via opening aligned with a conductor;
forming a line opening to the via opening;

depositing an oxide coating over the dielectric material and in the via opening and the line opening;

performing via gouging, wherein the via gouging process removes the oxide coating on a bottom of the via opening and reduces a thickness of the oxide coating on a bottom of the line opening;

removing the oxide coating from all surfaces of the via opening and the line opening;

filling the gouged via opening and the line opening with a metallic liner and at least one conductive material; and performing a planarization of the metallic liner and the at least one conductive material, wherein a top of the at least one conductive material is co-planar with a top of the dielectric material.

2. The method of claim 1, further comprising removing a cap layer over the conductor prior to the depositing; and wherein the oxide coating is selectively deposited over the dielectric material and in the via opening but does not deposit on the conductor.

3. The method of claim 2, wherein a gouge in the conductor formed by the via gouging performing includes an edge distanced from a sidewall of the dielectric material after the oxide coating removing.

4. The method of claim 2, wherein the oxide coating depositing includes using a tri-methyl aluminum (AlMe$_3$) vapor at approximately 225° C., followed by a Tris(tbutoxy) silanol vapor at approximately 225° C.

5. The method of claim 4, wherein the oxide coating depositing occurs for approximately 5-10 minutes at a pressure of approximately 3 milliTorr.

6. The method of claim 1, wherein the oxide coating depositing includes non-conformally depositing the oxide coating.

7. The method of claim 6, further comprising isotropically etching the oxide coating prior to the via gouging performing so as to remove the oxide coating over the conductor.

8. The method of claim 6, further comprising providing a cap layer over the conductor prior to the forming, and wherein the via gouging performing removes the cap layer over the conductor.

9. The method of claim 1, wherein the oxide coating removing includes using a hydrofluoric acid (HF) based process or chemical oxide removal (COR) process.

10. A method comprising:

forming a via opening in a dielectric material, the via opening aligned with a conductor;

forming a line opening to the via opening;

forming a protective coating over the dielectric material and in the via opening and the line opening;

performing via gouging, wherein the via gouging process removes the protective coating on a bottom of the via opening and reduces a thickness of the protective coating on a bottom of the line opening;

removing the protective coating from all surfaces of the via opening and the line opening;

filling the gouged via opening and the line opening with a metallic liner and at least one conductive material; and performing a planarization of the metallic liner and the at least one conductive material, wherein a top of the at least one conductive material is co-planar with a top of the dielectric material.

11. The method of claim 10, further comprising the step of removing a cap layer over the conductor prior to the depositing; and wherein the protective coating is selectively deposited over the dielectric material and in the via opening but does not deposit on the conductor.

12. The method of claim 11, wherein a gouge in the conductor formed by the via gouging performing includes an edge distanced from a sidewall of the dielectric material after the protective coating removing.

13. The method of claim 11, wherein the protective coating includes an oxide, and the protective coating depositing includes using a tri-methyl aluminum (AlMe3) vapor at approximately 225° C., followed by a Tris(tbutoxy) silanol vapor at Approximately 225° C.

14. The method of claim 13, wherein the protective coating depositing occurs for approximately 5-10 minutes at a pressure of approximately 3 milliTorr.

15. The method of claim 10, wherein the protective coating depositing includes non-conformally depositing the protective coating.

16. The method of claim 15, further comprising isotropically etching the protective coating prior to the via gouging performing so as to remove the protective coating over the conductor.

17. The method of claim 15, further comprising providing a cap layer over the conductor prior to the forming, and wherein the via gouging performing removes the cap layer over the conductor.

18. The method of claim 10, wherein the protective coating includes an oxide and the protective coating removing includes using a hydrofluoric acid (HF) based process or chemical oxide removal (COR) process.

* * * * *